United States Patent [19]

Hogan et al.

[11] 4,402,997
[45] Sep. 6, 1983

[54] PROCESS FOR IMPROVING NITRIDE DEPOSITION ON A SEMICONDUCTOR WAFER BY PURGING DEPOSITION TUBE WITH OXYGEN

[75] Inventors: Richard H. Hogan; Jonathan C. Dahm, both of Austin, Tex.

[73] Assignee: Motorola, Inc., Schaumburg, Ill.

[21] Appl. No.: 378,927

[22] Filed: May 17, 1982

[51] Int. Cl.³ .......................................... H01L 21/318
[52] U.S. Cl. ...................................... 427/94; 118/715; 134/37; 427/95
[58] Field of Search ...................... 427/94, 95; 134/37; 118/715

[56] References Cited

U.S. PATENT DOCUMENTS

| | | | |
|---|---|---|---|
| 3,924,024 | 12/1975 | Naber | 427/95 |
| 3,983,198 | 9/1976 | Mangels | 427/94 |
| 4,098,923 | 7/1978 | Alberti | 427/95 |
| 4,279,947 | 7/1981 | Goldman | 427/94 |
| 4,376,796 | 3/1983 | Arrasmith | 427/93 |

Primary Examiner—John D. Smith
Attorney, Agent, or Firm—Anthony J. Sarli, Jr.; Jeffrey Van Myers; James L. Clingan, Jr.

[57] ABSTRACT

In a process for depositing nitride on semiconductor wafers in a tube, streaks can develop on the wafers. The streaks are eliminted by flowing oxygen through the tube between nitride depositions of different groups of wafers.

4 Claims, 2 Drawing Figures

PROCESS FOR IMPROVING NITRIDE DEPOSITION ON A SEMICONDUCTOR WAFER BY PURGING DEPOSITION TUBE WITH OXYGEN

FIELD OF THE INVENTION

This invention relates, in general, to semiconductor processes, and more particularly to processes which include depositing nitride on a semiconductor wafer.

BACKGROUND ART

Typically, at some step in the manufacture of semiconductors, nitride is deposited on semiconductor wafers. A typical process for nitride deposition on semiconductor wafers of silicon includes reacting ammonia ($NH_3$) with diclorosilane ($SiH_2CL_2$, hereinafter referred to as DCS) to obtain silicon nitride ($Si_3N_4$). The reaction is as follows:

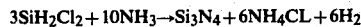

The $NH_4CL$ and $H_2$ are just by-products of the reaction. Typically, wafers are inserted inside a tube which has quartz ($SiO_2$) walls for receiving silicon nitride at a low pressure. DCS and ammonia are then introduced and form the silicon nitride which is deposited upon the wafers. When a tube has been sued for this purpose, a problem develops wherein the wafers which subsequently receive a nitirde deposition have what appear to be streaks across their faces. Observation under a microscope reveals that the streaks are comprised of many spots of excessive nitride growth. Wafers which have such spots of excessive nitride growth are rejected because of the resulting non-uniformity on the surface which can cause problems with subsequent steps in the process. Attempts to solve the problem included varying tube pressure, varying tube temperature, varying DCS to ammonia ratio, introducing stand alone DCS and ammonia flows, and applying HCL. None of these, however, resulted in improvement of any significance.

SUMMARY OF THE INVENTION

An object of the subject invention is to provide an improved process for the deposition of nitride on semiconductor wafers.

A further object of the invention is to provide a process for the deposition of nitride on semiconductor wafes wherein the wafers are clear of spots of excessive nitride growth.

Yet another object of the invention is to purge a tube which is used for nitride deposition from contaminants prior to the insertion of semiconductor wafers which are to receive nitride deposition to prevent the formation of spots of excessive nitride growth on the wafers.

These and other objects are accomplished by the invention in a manufacturing process for consecutively subjecting groups of semiconductor wafers to nitride deposition in a heated tube. Each group of semiconductor wafers is subjected to a nitride deposition process step which comprises inserting the first group into the tube; introducing ammonia into the tube; introducing dichlorosilane into the tube whereby nitride is formed and deposited on the semiconductor wafers of the first group; clearing the tube of ammonia and dichlorosilane; and removing the first group from the tube. The improvement comprises introducing oxygen into the tube after removal of the first group to purge the tube before inserting the next group into the tube.

DESCRIPTION OF A PREFERRED EMBODIMENT

Figure 1:
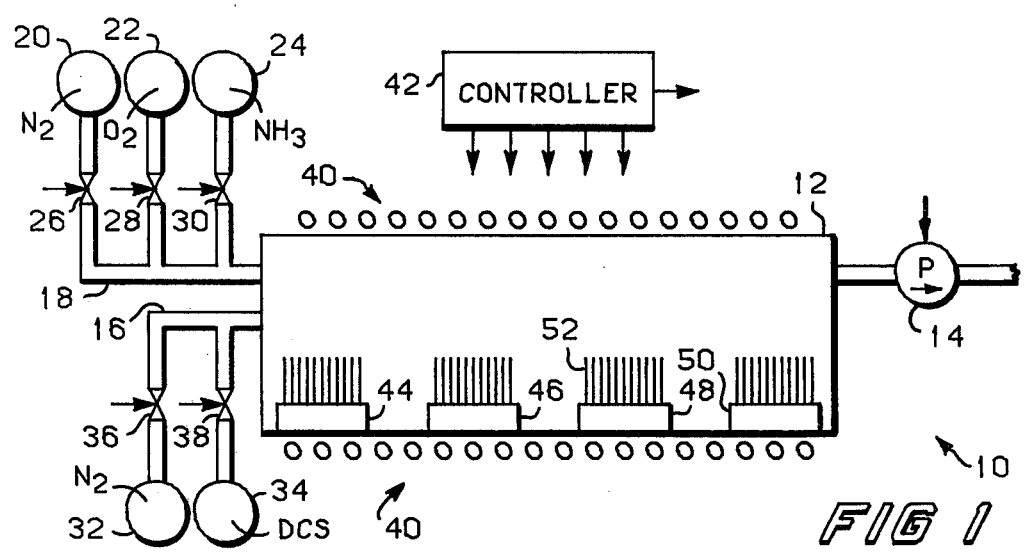
FIG. 1 shows in schematic form an apparatus useful in practicing the invention in one form.

Shown in FIG. 1 is an apparatus 10 for practicing the preferred embodiment. Apparatus 10 includes a tube 12, having a pump 14 at one end and gas entry pipes 16 and 18 at the other end. Containers 20, 22 and 24 of nitrogen ($N_2$), oxygen ($O_2$), and ammonia ($NH_3$), respectively, are coupled to tube 12 via pipe 18 under the control of flow controllers 26, 28 and 30, respectively. Containers 32 and 34 of nitrogen and dichlorosilane (DCS), respectively, are coupled to tube 12 via pipe 16 under the control of flow controllers 36 and 38, respectively. Pipes 16 and 18 are shown for convenience as one being over the other but in practice are preferably side by side. Heating coils 40 surround tube 12 to heat tube 12 to a desired temperature. A controller 42 provides signals to flow controllers 26, 28, 30, 36 and 38 and pump 14 to control the operation thereof. Tube 12 is of conventional quartz crystal of which Cryco is one manufacturer. Controller 42 is a Tylan Tymer Model 16. Pump 14 is a Leybold Model D27. Heating coils 40 are conventional heating coils of which Thermco is one maufacturer.

Boats 44, 46, 48 and 50 of semiconductor wafers are shown inside tube 12 with boat 44 nearest the gas entry end and boat 50 nearest the pump end. A typical wafer 52 is shown as being in boat 48. The semiconductor material of the wafers for the preferred embodiment is silicon. For convenience, FIG. 1 shows 11 wafers in each boat 44–50, whereas a typical boat in practice preferably holds 50 wafers.

Tube 12 is maintained at about 750° C. by heating coils 40. Boats 44–50 are inserted into tube 12 with the wafers facing the pump end. Tube 12 is pumped down by pump 14 to a vacuum of in the order of 1 milliTorr. Nitrogen from container 20 is flowed through tube 12 to purge tube 12 at a pressure of about 200 milliTorr for 10 minutes. Tube 12 is then again pumped down. Ammonia from container 24 is flowed through tube 12 at a rate of 135 standard cubic centimeters per minute (SCCM) for 3 minutes before introducing DCS from container 34. After the 3 minutes DCS is flowed through tube 12 at a rate of 30 SCCM while ammonia is still flowing at 135 SCCM. Pressure in tube 12 is about 500 milliTorr while both ammonia and DCS are flowing. With both DCS and ammonia flowing nitride is being deposited on the wafers. Consequently, the time duration chosen for flowing ammonia and DCS together is directly related to the desired nitride thickness on the wafers, i.e., the thicker the desired nitride, the longer the required time duration. Typically, the time duration is determined experimentally prior to a production run. An ammonia to DCS ratio of 4.5 to 1 is maintained even though the nitride reaction implies a 10 to 3 ratio in order to ensure the DCS fully reacts.

After the desired time duration has elapsed, the DCS flow is stopped while the ammonia flow continues for an additional 3 minutes to ensure there is no DCS residue. Tube 12 is pumped down again to complete the process of clearing tube 12 of ammonia and DCS. Nitrogen from container 20 is flowed into tube 12 for 5 minutes with pump 14 turned off to begin backfilling tube 12. Nitrogen from container 32 is flowed until atmospheric pressure is reached to complete the backfilling process. Nitrogen from container 20 is provided at a relatively low pressure compared to that provided by container 32. The backfilling process begins by introducing nitrogen from container 20 so that the pressure inside tube 12 does not change too rapidly. After tube 12 has been backfilled, boats 44–50 are removed.

After removal of boats 44–50 and prior to inserting another group of semiconductor wafers into tube 12, tube 12 is pumped down. Oxygen is flowed through tube 12 from container 22 for 20 minutes at a pressure of 2 Torr to purge tube 12. Tube 12 is then ready for the next group of semiconductor wafers. If another group of wafers is not ready for insertion, a good practice is to maintain a flow of nitrogen through tube 12 from container 20 until the next group of wafers is ready. When the next group of wafers is ready, tube 12 is backfilled by nitrogen from container 32 before tube 12 is opened for insertion of the wafers.

Figure 2:
FIG. 2 outlines process steps useful in understanding the present invention.

FIG. 2 shows the basic process steps of inerting a first group of wafers, introducing ammonia and DCS for the nitride deposition, removing the wafers, introducing oxygen to purge the tube, and then inserting the next group of wafers.

Before the process step of the oxygen purge was in use, tube 12 would often become contaminated so that wafers such as wafer 52 would have a large number of spots of excessive nitride growth. Visually the spots would collectively appear as streaks of white haze. Wafer 52 could have a streak which covered anywhere from a few percent of wafer 52 to almost the entire wafer 52. Analysis indicated the spots contained only silicon and nitrogen with no sign of contaminants such as chlorine or sodium. Electrical pinhole analysis showed that wafers with streaks had 50 to 150 percent more pinholes than wafers that did not have streaks. There was also a lowering of dielectric strength of streaked wafers. Experience also indicated that reliability problems developed in the course of processing. Additionally there was no practical way to rework streaked wafers. Accordingly scrapping of entire wafers became common place. The problem of streaking was more severe at the pump end. To compensate for this, no boat, such as boat 50, at the pump end was inserted. This reduced throughput. Even so, on occasion as many as 4% of the wafers would have to be scrapped for streaks. A number of experiments were tried. One set of experiments varied process parameters including tube pressure, tube temperature, DCS to ammonia ratio, and introducing a stand alone DCS flow. Only the DCS flow had any effect. It made the problem worse. Another discovery was that merely inserting wafers into a tube which exhibited the problem but using another tube for the nitride deposition which did not exhibit the problem still resulted in streaked wafers. Postulating that DCS was contaminating the tube which would in turn emanate particles onto inserted wafers causing excessive nitride growth on the wafers, resulted in trying experiments directed toward gettering DCS from the tube. Trying HCl and ammonia as gettering agents resulted in failure. Introducing oxygen resulted in the tube sparkling. Further experiments showed that a 20 minute flow of oxygen at 2 Torr virtually eliminated streaks. Use of a low DCS flow during initial coating of a tube resulted in the $O_2$ purge eliminating all streaks.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

We claim:

1. In a manufacturing process for depositing nitride on a semiconductor wafer, comprising the steps of:
placing the wafer in a heated tube;
introducing ammonia and dichlorosilane into the tube to deposit nitride on said wafer;
clearing the ammonia and dichlorosilane from the tube; and
removing the wafer from the tube;
the improvement comprising the additional step of:
purging the tube with oxygen before placing the wafer in the heated tube.

2. In a manufacturing process for depositing nitride on a semiconductor wafer, comprising the steps of:
placing the wafer in a heated tube;
introducing ammonia and dichlorosilane into the tube to deposit nitride on said wafer;
clearing the ammonia and dichlorosilane from the tube; and
removing the wafer from the tube;
the improvement comprising the additional step of:
purging the tube with oxygen after removing the wafer from the heated tube.

3. In a manufacturing process for consecutively subjecting groups of semiconductor wafers to nitride deposition in a heated tube wherein each group of semiconductor wafer is subjected to a nitride deposition process step, comprising:
inserting the first group to receive nitride into the tube;
introducing ammonia and dichlorosilane into the tube whereby nitride is formed and deposited on the semiconductor wafers of the first group;
clearing the tube of ammonia and dichlorosilane; and
removing the first group from the tube;
the improvement comprising:
introducing oxygen into the tube after removal of the first group to purge the tube before inserting the next group into the tube.

4. In a manufacturing process for depositing nitride on semiconductor wafers in a tube, the step of purging the deposition tube with oxygen between each use of the tube to provide semiconductor wafers which are clear of spots of excessive nitride growth.

* * * * *